United States Patent
Rzehak et al.

(10) Patent No.: US 8,750,015 B2
(45) Date of Patent: Jun. 10, 2014

(54) INTEGRATED CIRCUIT COMPRISING A FRAM MEMORY AND METHOD FOR GRANTING READ-ACCESS TO A FRAM MEMORY

(75) Inventors: Volker Rzehak, Ergolding (DE); Rudiger Kuhn, Freising (DE); Johannes Gerber, Unterschleissheim (DE); Matthias Arnold, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/025,878

(22) Filed: Feb. 11, 2011

(65) Prior Publication Data

US 2013/0114324 A1    May 9, 2013

(30) Foreign Application Priority Data

Feb. 11, 2010   (DE) .................. 10 2010 007 629

(51) Int. Cl.
   *G11C 11/22*   (2006.01)
(52) U.S. Cl.
   USPC ............ 365/145; 365/149; 365/228; 365/229
(58) Field of Classification Search
   USPC .................... 365/145, 149, 228, 229
   See application file for complete search history.

(56) References Cited

U.S. PATENT DOCUMENTS

| | | | | |
|---|---|---|---|---|
| 5,438,549 A | * | 8/1995 | Levy | 365/229 |
| 5,579,257 A | * | 11/1996 | Tai | 365/145 |
| 5,737,260 A | * | 4/1998 | Takata et al. | 365/145 |
| 5,768,208 A | * | 6/1998 | Bruwer et al. | 365/228 |
| 5,822,237 A | * | 10/1998 | Wilson et al. | 365/145 |
| 6,850,428 B2 | * | 2/2005 | Kang | 365/145 |
| 7,057,917 B2 | * | 6/2006 | Ogiwara et al. | 365/145 |
| 7,149,137 B2 | * | 12/2006 | Rodriguez et al. | 365/201 |
| 7,221,578 B2 | * | 5/2007 | Lee et al. | 365/145 |
| 7,375,998 B2 | * | 5/2008 | Yang | 365/145 |
| 8,064,242 B2 | * | 11/2011 | Kim | 365/145 |
| 8,437,169 B2 | * | 5/2013 | Xia et al. | 365/145 |
| 2009/0096506 A1 | | 4/2009 | Ogiwara et al. | |
| 2012/0062279 A1 | * | 3/2012 | Kuhn et al. | 327/65 |
| 2012/0155144 A1 | * | 6/2012 | Xia et al. | 365/145 |

FOREIGN PATENT DOCUMENTS

DE   10 2010 007 629.5   2/2010

* cited by examiner

*Primary Examiner* — Viet Q Nguyen
(74) *Attorney, Agent, or Firm* — Robert D. Marshall, Jr.; W. James Brady; Frederick J. Telecky, Jr.

(57) ABSTRACT

An electronic device includes an integrated circuit with a FRAM memory and an integrated capacitor connected between a power supply for the FRAM memory and ground. The integrated capacitor has a capacitance sufficient to store the charge necessary for a complete read-and-write-back cycle of the FRAM memory. When granting read-access to the FRAM memory, the FRAM memory is supplied by the integrated capacitor which is then disconnected from the integrated circuit power supply. Upon receiving a request for a read-access to the FRAM memory, a charge detector detects whether the internal capacitor is sufficiently charged for a complete read-and-write-back cycle of the FRAM memory. Read-access to the FRAM memory is only granted if the internal capacitor is sufficiently charged and disconnected from the power supply. An alternative embodiment alternately charges and powers the FRAM from two integrated capacitors.

10 Claims, 2 Drawing Sheets

INTEGRATED CIRCUIT COMPRISING A FRAM MEMORY AND METHOD FOR GRANTING READ-ACCESS TO A FRAM MEMORY

CLAIM OF PRIORITY

This application claims priority under 35 U.S.C. 119(a) to German Patent Application No. 10 2010 007 629.5 filed Feb. 11, 2010.

TECHNICAL FIELD OF THE INVENTION

The technical field of this invention is an electronic device comprising an integrated circuit with a FRAM memory and a method for granting read-access to a FRAM memory on an integrated circuit.

BACKGROUND OF THE INVENTION

FRAMs (Ferroelectric Random Access Memories) are becoming more and more popular. A FRAM is a non-volatile memory. A memory cell of a FRAM includes a ferroelectric capacitor having a ferroelectric material instead of a dielectric. A typical known ferroelectric used in FRAMs is PZT (lead zirconate titanate). This material is ferroelectric having a spontaneous electric polarization which can be reversed in the presence of an electric field. A reversed electric polarization remains reversed after the electric field is removed.

The ferroelectric material forms a crystal with a mobile atom that can move in the direction of an applied field. The polarity of the crystal depends on the position of this movable atom. The polarity remains once the electric field is removed. This preserves data within the memory without needing periodic refresh. Because there is no physical barrier, the atom may switch in less than 1 ns. FRAM writes are thus extremely quick. The write speed for FRAM is around 55 ns as compared to the much slower 5 ms write speed for EEPROMs. Thus FRAMs may be written to during one clock cycle. FRAMs also require much less write power than EEPROM and flash memories.

A read-access to a ferroelectric random access memory is a write-access followed by sensing. A "0" is written to discover the original data stored. If the original data was a "1", writing a "0" would change the polarity in the cell. The central atom then passes through the crystal's center and emits a charge spike which can be sensed as a current spike on the sensing wire. If the original data was a "0", there will be no charge spike. Thus sensing the presence of a charge or of current spike on the sensing wire determines the original data of the accessed cell.

FRAM memory technology has a drawback because each read-access thus destroys the content of the cells read contrary to other memory technologies. Therefore, after each read-access the data needs to be written back into the cells to restore the original content. The write-back is generally performed by a sense amplifier which is activated to drive the bit line to the full supply voltage if the voltage developed on the bit line corresponds to a stored data "1" and drive the bit line to 0 V if the voltage on the bit line corresponds to a stored data "0".

The read-access time for a FRAM memory is about twice of the read-access time for an EEPROM or a flash memory because of this necessary write-back process. Thus EEPROMs and flash memories remain popular in applications that demand numerous memory reads but only occasional memory writes. On the other hand, ferroelectric memories are superior to EEPROMs and flash memories in the overall power consumption. Therefore together with the extremely fast write-access times, it would be an advantage to use FRAM memories in all kind of applications. However to use a FRAM as program memory, the write-back after a read-access must be ensured under all conditions. These conditions include shorts on the supply pins. Otherwise the integrity of the memory would not be guaranteed. If a FRAM memory includes program data and a short on the supply voltage occurs with a very fast voltage rupture, parts of the FRAM memory may be destroyed. This could lead to complete failure of the electronic device using the FRAM memory. In contrast, a short on the supply voltage when flash memory includes program data will only lead to a reset.

It is known in the state of the art to provide a large external capacitor in the range of µFs for stabilizing the supply voltage and to ensure a slow voltage drop. However such a capacitor is liable to accidental shorts.

There is a need for an electronic device using a FRAM memory which ensures that after a read-access the necessary write-back is performed even for the case of a short-circuit.

There is further a need for a method for granting read-access to a FRAM memory which ensures an undisturbed write-back process.

SUMMARY OF THE INVENTION

The invention is an electronic device including an integrated circuit with a FRAM memory. The integrated circuit includes an integrated capacitor connected between a power supply for the FRAM memory and ground. The integrated capacitor has a capacitance sufficient to store the charge necessary for a complete read-and-write-back cycle of the FRAM memory. With this capacitor integrated on the integrated circuit together with the FRAM memory, it cannot be shorted by an external event. Since the integrated capacitor has a capacitance sufficient to store the charge necessary for a complete read-and-write-back cycle of the FRAM memory, once the capacitor is charged a complete read-and-write-back cycle is ensured. The capacitance may be in the range of 2 to 4 nF. This value varies greatly with the application and the FRAM architecture. The charge needed for a read-and-write-back cycle of a FRAM memory depends on the architecture of the memory. The capacitance can be matched or scaled to the needs of the specific FRAM design. It can thus be optimized for costs and area based on the used FRAM.

The capacitance may be just sufficient to store the charge necessary for a complete read-and-write-back cycle of the FRAM memory. This capacitor does not need a greater capacitance. A smaller capacitance would not guarantee a successful read-and-write-back cycle of the FRAM memory.

The needed area on the integrated circuit for the capacitor is proportional to its capacitance. The needed capacitance depends on the charge required and the voltage used. This is expressed by:

$$Q = C \times U$$

where: Q is the charge stored on the capacitor; C is the capacitance of the capacitor; and U is the voltage. Depending on the technology used, the voltage can be boosted to reduce the needed capacitance and thus the required area.

In an embodiment, the electronic device includes a charge detector detecting whether the integrated capacitor is sufficiently charged for a complete read-and-write-back cycle. By detecting this charge it is possible to make sure that the charge is sufficient.

In an advantageous embodiment, the integrated circuit further includes a switch connected between the power supply for the FRAM memory and the integrated capacitor. The integrated capacitor can be disconnected from the power supply during a complete read-and-write-back cycle using this internal switch. Upon disconnection of the internal capacitor from the power supply, any event on the power supply will not affect the charge on the internal capacitor.

The device further advantageously includes an access controller connected to the switch and to the charge detector. The access controller gives read-access to the FRAM memory only if the charge detected on the integrated capacitor is sufficient for a complete read-and-write-back cycle of the FRAM memory and the switch has disconnected the integrated capacitor from the power supply. This supplies the FRAM memory only from the charge stored on the internal capacitor. This also disconnects the FRAM memory from the external power supply during a read-and-write-back cycle. The read-and-write-back cycle will start only if the charge on the internal capacitor is sufficient for the whole read-and-write-back cycle. Read-access is denied in case of insufficient charge. This ensures the read-access for the FRAM memory. Even if a sudden power loss occurs, the read-and-write-back cycle can complete.

In an embodiment, the access controller is implemented with Muller-C-elements forming an asynchronous state machine. The controller is thus self-timed and does not require a clock source. A synchronous implementation is also possible. A timeout counter which causes a reset after timeout prevents any undefined state.

An advantageous embodiment includes a second internal capacitor. The two capacitors are used alternatively. One capacitor supplies the FRAM with the stored charge while the other capacitor is charged. Two read-and-write-back cycles may succeed each other faster because there no time is lost charging the capacitor. This shortens the overall read-access time.

The invention further provides a method for granting read-access to a FRAM memory on an integrated circuit. The FRAM memory is supplied by a capacitor internal to the integrated circuit. The method receives a request for a read-access to the FRAM memory. The method detects whether the internal capacitor is sufficiently charged for a complete read-and-write-back cycle of the FRAM memory. The last step of the method grants read-access to the FRAM memory only if the internal capacitor is sufficiently charged.

In an embodiment the internal capacitor is charged only after receiving a request for a read-access to the FRAM memory.

In another embodiment the internal capacitor is charged after each complete read-and-write-back cycle of the FRAM memory.

Advantageously, the method further disconnects the internal capacitor from the power supply prior to granting read-access to the FRAM memory. This prevents any event occurring during the read-and-write-back cycle from interfering with the internal capacitor.

In a further embodiment, the method connects the internal capacitor to the power supply only during charging.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
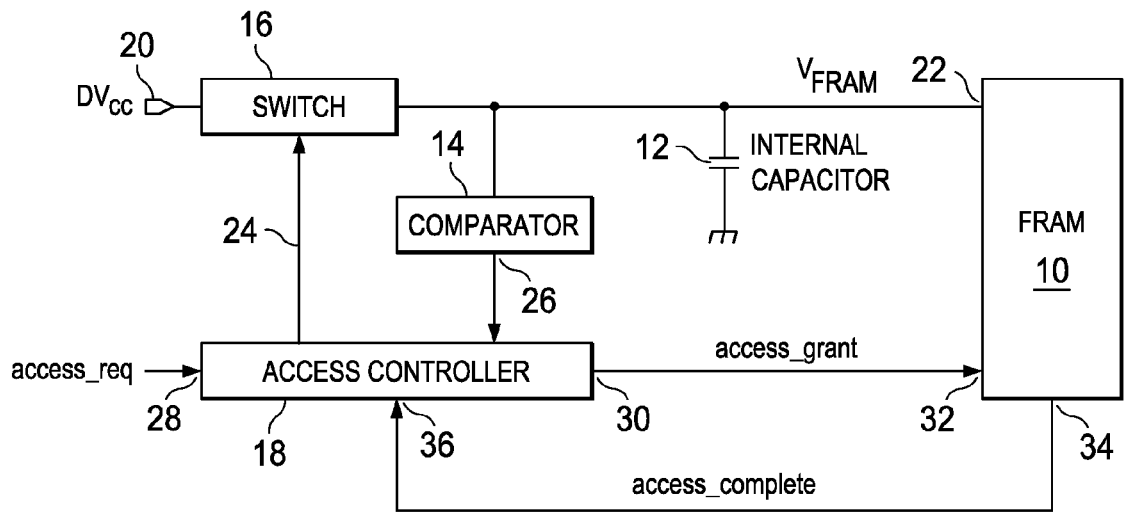
FIG. 1 is a simplified schematic of an electronic device according to the invention.

FIG. 1 shows FRAM memory 10, internal capacitor 12, comparator 14, switch 16 and access controller 18 included in an electronic device according to the invention. Switch 16 is connected between power supply 20 ($DV_{CC}$) and supply input 22 of FRAM memory 10. Switch 16 is controlled by access controller 18 via line 24. Internal capacitor 12 has a first terminal connected to supply input 22 ($V_{FRAM}$) of FRAM memory 10 and a second terminal connected to ground. Comparator 14 is a charge detector configured to detect the charge on internal capacitor 12. Comparator 14 is connected to the first terminal of internal capacitor 12. Comparator 14 has a signal output 26 connected to access controller 18 which signals when the charge on internal capacitor 12 is sufficient for a complete read-and-write-back cycle. Access controller 18 has an input 28 receiving a read-access request (access_req) from another part of the system. Access controller 18 has signal output 30 connected to enable input 32 of FRAM memory 10 signaling that a read-access is granted. FRAM memory 10 has signal output 34 connected to signal input 36 of access controller 18 signaling that a read-and-write-back cycle of FRAM memory 10 has completed. Conventional address and data lines to FRAM memory 10 are not shown in FIG. 1.

In an initial idle state access controller 18, which is a state machine, outputs a signal at signal output 30 to disable FRAM read-access (access_grant=0). In the idle state, access controller 18 outputs a signal line 24 that controls switch 16 to be open.

Upon reception of a read-access request on signal input 28, access controller 18 sends a signal on line 24 to switch 16 closing switch 16. FRAM read-access remains disabled via access_grant=0 on signal output 30. With switch 16 closed, the first terminal of internal capacitor 12 is connected to power supply 20. This charges internal capacitor 12. Charge detector 14 detects when internal capacitor 12 is sufficiently charged for a complete read-and-write-back cycle of the FRAM memory. In this case, charge detector 14 outputs at its signal output 26 a charge completed signal to access controller 18.

Upon reception of the charge completed signal access controller 18 sends a signal to switch 16 via line 24 to open switch 16. Access controller 118 then outputs a read-access granted signal (access_grant=1) on output 30 to enable input 32 of FRAM memory 10. Then FRAM memory 10 reads data at an indicated address, delivers this data to the requesting device and writes back the data read. Once the read-and-write-back cycle of the FRAM memory is completed, FRAM memory 10 outputs via output 34 an access completed signal (access_complete=1) to access controller 18 at input 36. Internal capacitor 12 will be at least partly discharged because the whole read-and-write cycle was powered by the charge on internal capacitor 12. Access controller 18 then waits for the next read-access request.

In another embodiment, access controller 18 on reception of the access completed signal from FRAM memory 10 closes switch 16 to recharge internal capacitor 12 immediately and reopens switch 16 when comparator 14 generates a signal on output indicating the charge on internal capacitor 12 is sufficient for a complete read-and-write-back cycle.

Whether the internal capacitor 12 is charged immediately after a read-and-write-back cycle or after request of a read-access depends on the frequency of read-access requests and the required read-access time.

Figure 2:
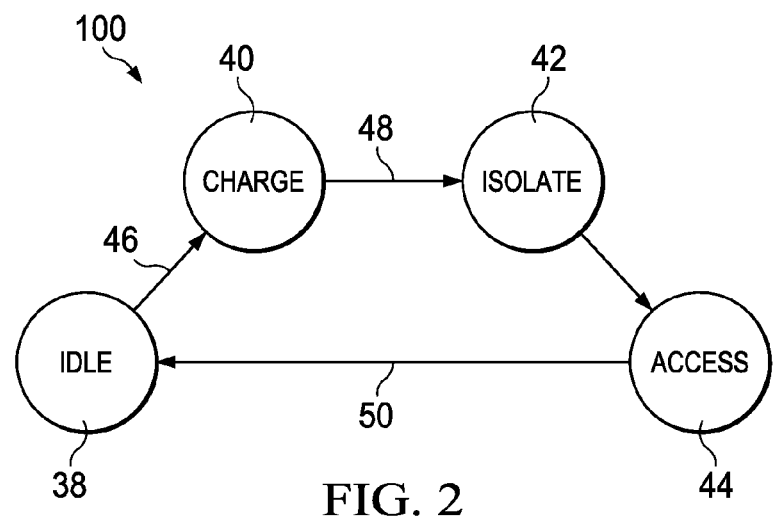
FIG. 2 is a state diagram visualizing the inventive method.

FIG. 2 illustrates the different steps of method 100 alternately understood as the states of a state machine controlled by access controller 18. State 38 is the idle state. State 40 charges charging internal capacitor 12. State 42 represents isolates internal capacitor 12. State 44 grants read-access to FRAM memory 10.

In the idle state 38 switch 16 is open and FRAM read-access is disabled. Upon a request of read-access to the FRAM memory 10 on state change 46, method 100 enters the charging internal capacitor 12 state 40. In charging state 40 switch 16 is closed and FRAM read-access remains disabled. When comparator 14 determines the voltage on internal capacitor 12 is above the required level, state change 48 moves method 100 to state 42. In state 42 switch 16 is opened thus isolating internal capacitor 12 from power supply 20. FRAM read-access remains disabled. Method 100 automatically moves to state 44. In state 44 FRAM memory 10 may be accessed for reading data via $access_{13}$ grant=1. Switch 16 remains open. FRAM memory 10 performs a read-and-write-back cycle as powered by the charge in capacitor 12. When FRAM memory 10 indicates via the $access_{13}$ complete signal that the read-and-write-back cycle is completed, method 100 returns via state change 50 to idle state 38. Switch 16 opens and FRAM read-access is disabled.

As explained with reference to FIG. 1, it is possible to perform the charging of state 40 between the access step 44 and idle step 38.

Figure 3:
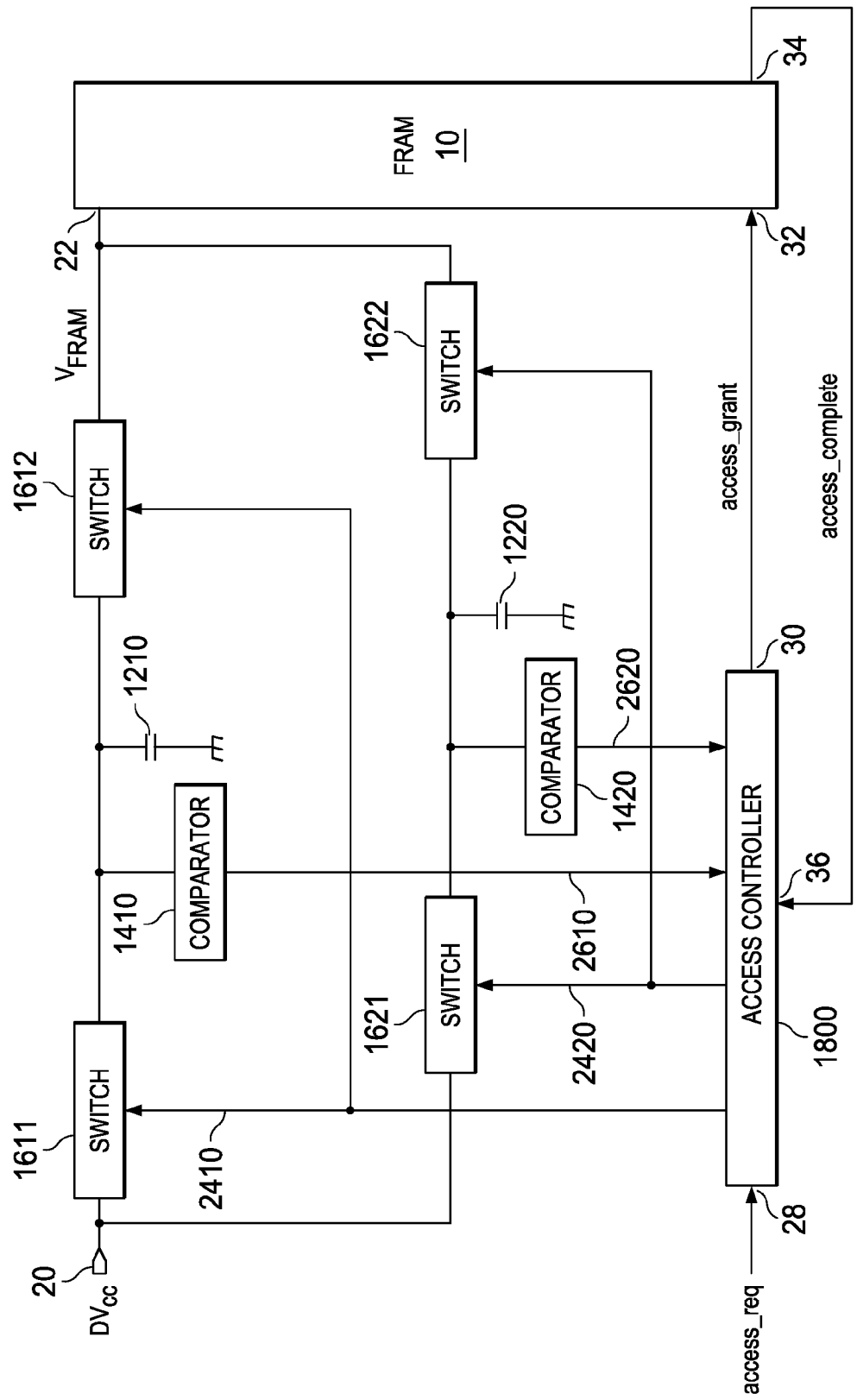
FIG. 3 is a simplified schematic of an electronic device according to an alternative embodiment of the invention.

In both cases described above, two succeeding read-and-write-back cycles are always separated by the time necessary to recharge internal capacitor 12. FIG. 3 illustrates a further embodiment using a second internal capacitor. FIG. 3 shows FRAM memory 10 (unchanged from FIG. 2), internal capacitors 1210 and 120, comparators 1410 and 1420, switches 1611, 1612, 1621 and 1622 and access controller 1800 included in an electronic device according to the invention. Switches 1611 and 1612 connect capacitor 1210 to either power supply 20 ($DV_{CC}$) or supply input 22 of FRAM memory 10. Switches 1621 and 1622 connect capacitor 1220 to either power supply 20 ($DV_{CC}$) or supply input 22 of FRAM memory 10. Switches 1611 and 1612 are controlled by access controller 1800 via line 2410. Switches 1621 and 1622 are controlled by access controller 1800 via line 2420. Internal capacitors 1210 and 1220 each has a first terminal connectable to supply input 22 ($V_{FRAM}$) of FRAM memory 10 and a second terminal connected to ground. Comparator 1410 and 1420 are a charge detectors configured to detect the charge on respective internal capacitors 1210 and 1220. Comparator 1410 is connected to the first terminal of internal capacitor 1210. Comparator 1410 has a signal output 2610 connected to access controller 1800 which signals when the charge on internal capacitor 1210 is sufficient for a complete read-and-write-back cycle. Comparator 1420 has a signal output 2620 connected to access controller 1800 which signals when the charge on internal capacitor 1220 is sufficient for a complete read-and-write-back cycle. Access controller 1800 has an input 28 receiving a read-access request (access_req) from another part of the system. Access controller 1800 has signal output 30 connected to enable input 32 of FRAM memory 10 signaling that a read-access is granted. FRAM memory 10 has signal output 34 connected to signal input 36 of access controller 1800 signaling that a read-and-write-back cycle of FRAM memory 10 has completed. Conventional address and data lines to FRAM memory 10 are not shown in FIG. 2.

Capacitors 1210 and 1220 are used alternately. Thus, during a read-and-write-back cycle internal capacitor 1220 may be charged being connected to power supply 20 while internal capacitor 1210 is isolated from power supply 20 and supplies FRAM memory. During the following read-and-write-back cycle of FRAM memory internal capacitor 1210 is isolated from power supply 20 and supplies FRAM memory while internal capacitor 1220 is connected to poser supply 20 to be charged. Access controller 1800 is configured to control the alternative use of the two capacitors.

Although the invention has been described hereinabove with reference to a specific embodiment, it is not limited to this embodiment and no doubt further alternatives will occur to the skilled person that lie within the scope of the invention as claimed.

What is claimed is:
1. An integrated circuit comprising:
a Ferroelectric Random Access Memory (FRAM);
an integrated capacitor connected between a power supply for said FRAM memory and ground, the integrated capacitor having a capacitance sufficient to store a charge necessary for a complete read-and-write-back cycle of said FRAM memory; and
a switch connected between the power supply for said FRAM memory and said integrated capacitor, said switch operable to selectively connect or disconnect said integrated capacitor from the power supply.
2. The integrated circuit of claim 1, further comprising:
a charge detector connected to the integrated capacitor, said charge detector outputting a charge completed signal if said integrated capacitor is sufficiently charged for a complete read-and-write-back cycle of said FRAM.
3. The integrated circuit of claim 1, further comprising:
an access controller connected to said switch, said charge detector and an read-access input of said FRAM, said access controller supplying a signal to the read-access input of said FRAM permitting read-access to said FRAM memory only if said charge detector outputs said charge completed signal indicating the charge detected on said integrated capacitor is sufficient for a complete read-and-write-back cycle of said FRAM memory and said switch has disconnected said integrated capacitor from the power supply.
4. The integrated circuit of claim 3, wherein:
said access controller is implemented with Muller-C-elements forming an asynchronous state machine.
5. An integrated circuit comprising:
a Ferroelectric Random Access Memory (FRAM) having a power input, an access grant input and a read-and-write-back cycle complete output;
a first integrated capacitor having a first terminal and second terminal connected to ground, the first integrated capacitor having a capacitance sufficient to store a charge necessary for a complete read-and-write-back cycle of said FRAM memory;
a first charge detector connected to said first integrated capacitor, said first charge detector outputting a first charge completed signal if said first integrated capacitor is sufficiently charged for a complete read-and-write-back cycle of said FRAM;
a first set of switches connected to a power supply, said power input of said FRAM and said first terminal of said first integrated capacitor, said first set of switches alter- nately connecting said first terminal of said first integrated capacitor to the power supply and to said power input of said FRAM;

a second integrated capacitor having first and second terminals, the second integrated capacitor having a capacitance sufficient to store a charge necessary for a complete read-and-write-back cycle of said FRAM memory;

a second charge detector connected to said second integrated capacitor, said second charge detector outputting a second charge completed signal if said second integrated capacitor is sufficiently charged for a complete read-and-write-back cycle of said FRAM;

a second set of switches connected to a power supply, said power input of said FRAM and said first terminal of said second integrated capacitor, said second set of switches alternately connecting said first terminal of said second integrated capacitor to said power input of said FRAM and to the power supply;

an access controller connected to said FRAM, said first and second sets of switches and said first and second charge detectors and receiving an access request signal, said access controller operable upon receipt of an access request signal to control a first of said first and second switches to connect a corresponding one of said first or second integrated capacitor to said power input of said FRAM, control a second of said first and second switches to connect a corresponding one of said first or second integrated capacitor to said power supply, control said first of said first and second switches to disconnect said corresponding one of said first or second integrated capacitor from said power input of said FRAM upon receipt of said read-and-write-back cycle complete output from said FRAM, and control a second of said first and second switches to disconnect a corresponding one of said first or second integrated capacitor from said power supply upon receipt of a charge complete signal from a corresponding one of said first and second charge detectors.

6. A method for granting read-access to a Ferroelectric Random Access Memory (FRAM) on an integrated circuit, comprising the steps of:

supplying the FRAM memory by a capacitor internal to the integrated circuit;

upon receiving a request for a read-access to the FRAM memory, detecting whether the capacitor internal to the integrated circuit stores sufficient charge for a complete read-and-write-back cycle of the FRAM memory and disconnecting the capacitor internal to the integrated circuit from the power supply; and granting read-access to the FRAM memory only if the capacitor internal to the integrated circuit stores sufficient charge and the capacitor internal to the integrated circuit is disconnected from the power supply.

7. The method of claim 6, further comprising the step of:
charging the capacitor internal to the integrated circuit only after receiving the request for a read-access to the FRAM memory.

8. The method of claim 6, further comprising the step of:
charging the capacitor internal to the integrated circuit after a complete read-and-write-back cycle of the FRAM memory.

9. The method of claim 6, further comprising the step of:
connecting the capacitor internal to the integrated circuit to the power supply only during charging.

10. A method for granting read-access to a Ferroelectric Random Access Memory (FRAM) on an integrated circuit, comprising the steps of:

upon receiving a request for a read-access to the FRAM memory alternately (1) supplying the FRAM memory by a first capacitor internal to the integrated circuit and charging a second capacitor internal to the integrated circuit and (2) supplying the FRAM memory by the second capacitor internal to the integrated circuit and charging the first capacitor internal to the integrated circuit;

ceasing supply of the FRAM memory from one of the first and second capacitor internal to the integrated circuit upon completion of a FRAM read-and-write-back cycle; and ceasing charging one of the first and second capacitor internal to the integrated circuit upon detecting the corresponding capacitor internal to the integrated circuit stores sufficient charge for a complete read-and-write-back cycle of the FRAM memory.

* * * * *